(12) United States Patent
Spadaccini et al.

(10) Patent No.: US 9,492,969 B2
(45) Date of Patent: Nov. 15, 2016

(54) HIGH RESOLUTION PROJECTION MICRO STEREOLITHOGRAPHY SYSTEM AND METHOD

(75) Inventors: Christopher M. Spadaccini, Oakland, CA (US); George Farquar, Livermore, CA (US); Todd Weisgraber, Brentwood, CA (US); Steven Gemberling, Livermore, CA (US); Nicholas Fang, Champaign, IL (US); Jun Xu, Urbana, IL (US); Matthew Alonso, Freeport, IL (US); Howon Lee, Urbana, IL (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 83 days.

(21) Appl. No.: 13/149,773

(22) Filed: May 31, 2011

(65) Prior Publication Data

US 2015/0309473 A1    Oct. 29, 2015

Related U.S. Application Data

(60) Provisional application No. 61/349,627, filed on May 28, 2010.

(51) Int. Cl.
| | |
|---|---|
| G03H 1/02 | (2006.01) |
| B29C 67/00 | (2006.01) |
| G02B 1/00 | (2006.01) |
| G02B 5/00 | (2006.01) |
| G02B 27/56 | (2006.01) |
| G03H 1/00 | (2006.01) |
| G03H 1/22 | (2006.01) |
| G03F 7/20 | (2006.01) |
| B33Y 30/00 | (2015.01) |
| B33Y 10/00 | (2015.01) |

(52) U.S. Cl.
CPC ....... *B29C 67/0051* (2013.01); *B29C 67/0062* (2013.01); *G02B 1/002* (2013.01); *G02B 5/008* (2013.01); *G02B 27/56* (2013.01); *G03F 7/70408* (2013.01); *G03F 7/70416* (2013.01); *G03H 1/0005* (2013.01); *G03H 1/2294* (2013.01); *B33Y 10/00* (2014.12); *B33Y 30/00* (2014.12); *G03H 2001/0094* (2013.01); *G03H 2225/60* (2013.01)

(58) Field of Classification Search
CPC ............... G03H 1/268; G03H 1/0005; G03H 2001/0094; G03H 2001/2695; B33Y 10/00; B33Y 30/00; B33Y 70/00
USPC ....................................... 359/1–35, 237–324
See application file for complete search history.

(56) References Cited

U.S. PATENT DOCUMENTS

| | | | | | |
|---|---|---|---|---|---|
| 5,589,955 | A | * | 12/1996 | Amako | B23K 26/0656 359/10 |
| 8,649,094 | B2 | * | 2/2014 | Kurtz | G02B 7/028 359/434 |
| 2004/0245102 | A1 | * | 12/2004 | Gilbert | B01D 63/087 204/451 |

OTHER PUBLICATIONS

Chen, Jian et al., "Far-field superlens for nanolithography", 2010, Chin. Phys. B, 19.3, 034202-1-034202-7. Print.*

*Primary Examiner* — Scott J Sugarman
*Assistant Examiner* — Kristina Deherrera
(74) *Attorney, Agent, or Firm* — James S. Tak

(57) ABSTRACT

A high-resolution PμSL system and method incorporating one or more of the following features with a standard PμSL system using a SLM projected digital image to form components in a stereolithographic bath: a far-field superlens for producing sub-diffraction-limited features, multiple spatial light modulators (SLM) to generate spatially-controlled three-dimensional interference holograms with nanoscale features, and the integration of microfluidic components into the resin bath of a PμSL system to fabricate microstructures of different materials.

6 Claims, 8 Drawing Sheets

HIGH RESOLUTION PROJECTION MICRO STEREOLITHOGRAPHY SYSTEM AND METHOD

CROSS-REFERENCES TO RELATED APPLICATIONS

This application claims the benefit of U.S. Provisional Application No. 61/349,627, filed May 28, 2010 and incorporated by reference herein.

FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to projection micro-stereolithography (PµSL) systems and methods, and more particularly to an improved high-resolution PµSL system and method having one or more of the following features: a far-field superlens for producing sub-diffraction-limited features, multiple spatial light modulators (SLM) to generate spatially-controlled three-dimensional interference holograms with nanoscale features, and the integration of microfluidic components into the resin bath of a PµSL system to fabricate microstructures of different materials.

BACKGROUND OF THE INVENTION

Stereolithography (SL) is a known rapid prototyping technology which enables the generation of scale models of complicated three-dimensional parts in a fraction of the time and at a fraction of the cost of traditional methods. Generally, SL involves the use of electromagnetic radiation (e.g. a UV laser beam) to cure a photosensitive liquid (e.g. liquid photosensitive monomer or resin) which solidifies upon exposure to electromagnetic radiation of a given wavelength. When a layer is fully solidified upon exposure, the component stage drops down to allow a fresh layer of photosensitive liquid to flow over the solid surface. In this manner, a three-dimensional (3D) structure is fabricated from the bottom up, a layer at a time. SL provides a useful tool for visualizing components to assist in the iterative design process, as well for the direct fabrication of functional parts and microdevices.

Various stereolithographic methods are known for three-dimensional fabrication of microsystems. A first basic technique uses a scanning laser system to serially trace the shape of the desired part in a line-by-line manner over the free surface of a photosensitive resin bath. The laser is controlled by a CAD system that functions as an electronic mask, and typically allows for a transverse resolution of about 150 µm. In addition, the photopolymer can be loaded with ceramic, metal, or other particles to generate components of different materials. After initial stereolithographic fabrication, the parts can be sintered to remove the polymer and densify the functional material of interest. This usually shrinks the part by some controllable amount. An improvement on the scanning laser technique is known as the "Two Photon Absorption" method. This process uses two low power, pulsed laser beams which intersect deep within the resin bath. At the intersection point, the beams form a small volume which has sufficient photon flux to polymerize only the local material in the volume. While the beams can write a completely three-dimensional pattern into the resin bath, this is typically a slow process because it writes in a point-by-point fashion. Moreover, the types of resins available for this technique are severely limited due to the need that they be highly transparent to the laser beams, which also effectively prevents the loading of ceramic or metal particles in the resin bath.

Projection micro-stereolithography (PµSL) is a third, low cost, high throughput, micro-scale, stereolithography technique which projects a two dimensional image onto a photosensitive resin bath rather than a single spot, to fabricate complex three-dimensional microstructures in a bottom-up, layer-by-layer fashion. Originally, PµSL was first accomplished by using a set of photomasks to project the two-dimensional image. Although effective, this method requires a large number of photomasks thus limiting the practical number of layers possible. The use of a dynamically reconfigurable mask via a spatial light modulator (SLM) in PµSL systems dramatically reduced process time resulting in structures with thousand of layers. This was demonstrated in the form of a liquid crystal display (LCD) in the paper "*Ceramic Microcomponents by Microstereolithography*" by Bertsch et al (2004 IEEE). However, the LCD had some intrinsic drawbacks including large pixel sizes and low switching speeds.

The use of a Digital Micromirror Device (DMD, a trademark of Texas Instruments) as the SLM in a PµSL system is described in the paper "*Projection Micro-Stereolithography Using Digital Micro-Mirror Dynamic Mask*" by C. Sun et al (2005 Elsevier). Similar to conventional SL techniques, PµSL with a SLM is capable of fabricating complex three-dimensional microstructures in a bottom-up, layer-by-layer fashion. A CAD model is first sliced into a series of closely spaced horizontal planes. These two-dimensional slices are digitized in the form of an electronic image and transmitted to the SLM. A UV lamp or LED illuminates the SLM which acts as a dynamically reconfigurable photomask and transmits the image through a reduction lens into a bath of photosensitive resin. The resin that is exposed to the UV light is cured and anchored to a platform and z-axis motion stage. The stage is then lowered a small increment and the next two-dimensional slice is projected into the resin and cured on top of the previously exposed structure. This layer-by-layer fabrication continues until the three-dimensional part is complete.

It is also known that imaging and lithography using conventional optical components is restricted by the diffraction limit. Features resolution in these systems is limited to one half of the wavelength of the incident light because they can only transmit the propagating components emanating from the source. It would be advantageous to provide an improved PµSL-based fabrication system and method capable of fabricating three-dimensional structures having sub-diffraction limited features, as well as other capabilities which enhance the resolution, materials flexibility, and process performance of standard PµSL.

SUMMARY OF THE INVENTION

One aspect of the present invention includes a projection micro-stereolithography (PµSL) system for producing sub-diffraction-limited features, comprising: a light source; a spatial light modulator (SLM) illuminated by the light source; a reduction lens; a stereolithographic bath containing a photosensitive resin; and a far-field superlens (FSL) contactedly interfacing the photosensitive resin, said FSL including a dielectric layer and a metal grating layer, wherein the FSL is arranged to convert a far-field image produced by the SLM and reduced by the reduction lens into a near-field image for curing select regions of the photosensitive resin.

Another aspect of the present invention includes a projection micro-stereolithography (PμSL) system, comprising: a light source; a spatial light modulator (SLM) illuminated by the light source; a reduction lens; a stereolithographic bath containing a photosensitive resin; and a microfluidic system integrated with the stereolithographic bath, said microfluidic system having at least one inlet port fluidically connected to deliver at least one type of photosensitive resin from at least one source, and at least one outlet port.

Another aspect of the present invention includes a holographic projection micro-stereolithography (PμSL) system, comprising: a stereolithographic bath containing a photosensitive resin; and at least two light projection systems, each projection system comprising a light source; and a spatial light modulator (SLM) illuminated by the light source for illuminating the photosensitive resin with a digital image, so that the holographic interference of all the digital images in the photosensitive resin cures select regions of the photosensitive resin.

Generally, the present invention involves an improved high-resolution PμSL system and method capable of rapidly fabricating complex three-dimensional meso- to micro-scale structures and components with micro/nano-scale precision (i.e. including sub-diffraction-limited features). Similar to conventional PμSL, the present invention utilizes a SLM (such as for example a DMD or a Liquid Crystal on Silicon (LCoS)) as a dynamically reconfigurable photomask to project a two-dimensional image onto the free surface of a photosensitive resin bath. The resin is cured and lowered a small increment into the bath and a new image is projected and cured on the top of the previously developed structure, to build a three-dimensional part in a layer-by-layer fashion, from the bottom up. Additionally, the PμSL system and method of the present invention also incorporates one or more of the following functional features to improve resolution, flexibility, and process performance of standard PμSL: an integrated far-field superlens (FSL) which overcomes the diffraction limit of light (i.e. one-quarter wavelength) to produce nanometer scale features (tens of nanometers or less than one-quarter the UV light wavelength) on a wide range of substrates; and multiple SLMs arranged to generate spatially-controlled three-dimensional interference holograms with nanoscale features in a photosensitive resin bath of the PμSL to fabricate three-dimensional structures with a single exposure; and microfluidic components integrated with the photosensitive resin bath in order to use laminar flow control to optimally deliver and distribute multiple photosensitive resins and other materials, so as to produce multi-material microstructures.

Far-field Superlens (FSL)

The FSL used in the present invention is a thin-film grating-type structure (e.g. thin-film silver grating) which amplify evanescent waves (which decay exponentially in mediums with positive permittivity and permeability and carry subwavelength information) to produce features which exist below the diffraction limit. In particular, as used in the present invention, the thin-film grating-type structures of the FSL convert amplified evanescent waves into a propagating field, and thus convert a near-field effects into a far-field phenomenon. It is notable therefore that the fabricated sub-wavelength features are not simply a reduced or smaller version of the projected image from the SLM. There is not a 1:1 pattern transfer. Because the SLM projected image is passing through a grating, sub-wavelength features on the other side of the grating are fundamentally different in geometry to that which was projected. Therefore the SLM projected far-field image is calculated to generate the desired sub-wavelength features on the other side of the FSL grating.

The FLS takes the form of a thin layer of material with either negative permittivity or permeability (resulting in a negative index of refraction). Noble metals such as silver are good candidate materials for the FLS due to the ability to generate negative permittivity by the collective excitation of conduction electrons. The thin metal grating layer is designed such that the surface plasmons match the evanescent waves being imaged so that the FLS enhances the amplitude of the field. Features as small as 5 μm for example have been demonstrated.

The FSL includes a metallic grating layer connected to a dielectric layer. The dielectric layer is selected from a material that is transparent to the wavelength of a given light source, and has a dielectric permittivity that matches that of the metal layer (which may also be a metal-based composite or multilayer). Example types include glass, quartz, PMMA, PDMS, parylene, mineral oil, other oils, GaAs, ITO, etc. The thickness of the dielectric layer will be dependent on strength of evanescent wave, and in particular, should be less than the projected distance of the evanescent wave which is at most hundreds of nanometers. Dielectric layer thickness may be chosen based on the metallic grating layer thickness because different metal-wavelength combinations will have stronger Plasmon resonances and thus stronger projected evanescent wave fields. It is notable however, that this is typically within some small band, and still have to be very thin.

For the metallic grating layer of the FSL, a grating pattern is necessary for converting far-field images to near-field, though it can be dynamical, i.e. it can be generated optically, electrically or acoustically. It is appreciated that a non-grating thin metal film will form a simple near-field superlens. The periodicity of the grating pattern may be designed based on the wavelength of the light source and desired feature resolution. For example, a silver grating FSL for PμSL integration has been constructed having a periodicity of about 200 nm, a silver line width of 100 nm and a thickness of 50 nm. The grating aspect ratio (length/width) can be increased to produce a larger FSL and more area over which to fabricate. The metal grating layer thickness may be from tens of nanometers to hundreds of nanometers. Example types of metals may include, for example, silver, which is suitable for longer UV wavelengths (300-400 nm), or other metals such as for example aluminum, copper, gold, conductive oxides (ITO, doped ZnO), Na, K, Au—Ag alloy, Co—Au, Ni—Ag alloy, multi-layered graphenes, etc.

It is appreciated that the metallic grating layer may also be formed as a multilayer comprising several thin film layers of other materials, such as for example the combination of silver/MgO/silver composite (or silver, $Al_2O_3$, silver) which could serve as a superlens for wavelength of 500 nm. Such metal composite/multilayers may enable operation of the FSL at other wavelengths or simply may provide an alternative to silver in the UV range. The layers of the multilayer can consist of a seed or adhesion layer such as germanium or MgO. This is intended to provide smooth growth of metallic layer such as Ag or Au. There is also a composite layer made of metal and dielectrics, such as MgO/Ag/MgO/Ag . . . thin film stacks, or it can contain porous anodized Al2O3 or TiO2 with electroplated metal, such as Ag, Au, or conductive oxide fillers. The importance of the composite layer is to provide a impedance matching element for resonant transfer of evanescent waves. In addition, a layer is integrated to convert evanescent waves to far field. This can be implemented such as metallic grating or dynamic grating produced by photorefractive effect or electro-optical effects.

It is appreciated also that the FSL could be electro-optically tuned and potentially integrated with UV-emitters. For example, a ZnO nanowire emitter may be integrated with the FSL such that each of the emitters could be individually actuated, with tightly confined light spot with virtually no crosstalk. They may be used in combination with digital projection from far field, for near field pattern generations.

Digital Holographic PµSL

Digital holographic masks are also used in the present invention, which allows a variety of porous structures and materials to be established and aperiodic features to be intentionally positioned. In particular digital dynamic masks are used to project the computed hologram into liquid polymers for fabrication of highly interconnected functionally graded density materials with nanometer precision. While holographic nanolithography is a known method of 3D volumetric nanofabrication by interfering multiple coherent beams interfere in 3D space, the simple interference method typically cannot create designed defects and features of arbitrary shape. They are typically also limited by the depth of penetration in the solid photoreactive materials.

The present invention utilizes multiple light projection systems to project respective digital images to the fabrication zone, so as to holographically interfere and thereby cure select portions of the photosensitive resin, which is preferably chosen for photo-sensitivity and transparency. While the resin bath may be loaded with metal or ceramic powders, this will change the optical properties. Methods such as atomic layer deposition and electroplating may be used to infiltrate the polymer mold with liquid phase chemical reactants at low temperature.

Integration of Microfluidic Systems for Multi-material Fabrication

Another feature of the present invention is the integration of microfluidic components and sub-systems (in particular laminar flow systems) with the PµSL system to provide the capability of fabricating structures (such as 3D structures) with multiple, heterogeneous materials in the same component. By incorporating microfluidic systems into the resin bath of a PµSL system, the present invention has the ability to fabricate microstructures of different materials in one process. By slowly flowing layers of photosensitive resin a single exposure and curing step in one material can be completed. A new material (different resin or loading of metal/ceramic particles) can follow in another fluid layer. This material can then be exposed and cured resulting in a multilayer material. If the fluid is allowed to settle in void areas then multiple materials can be cured on the same image plane and concentric structures of different materials (such as double shelled targets) may be fabricated. Laminar flow microfluidic systems in particular provide for more uniform delivery and distribution of materials and to allow for multiple material components to be sequentially exposed.

Various types of materials (various photosensitive liquids or slurries with metal or ceramic nanoparticles) may be injected into the fabrication area through a single, valved, microfluidic channel and port allows for the ability to sequentially fabricate with different materials. For example, one material can flow into the fabrication zone and layers lithographically formed. This material then is removed via another microfluidic port while a new material flows into the fabrication zone. More features/layers may then be produced. The multiple materials could be in the same device layer or could form a layered structure. Furthermore, microfluidic integration may be implemented with multiple injection ports for various materials. These ports could be arranged around the fabrication area in almost any desired geometry including radially oriented or at different vertical positions. This would allow for more precise injection of different materials to specific locations in the fabrication zone. The injection could occur simultaneously or could be staged in time depending on the part to be fabricated. In general, this will allow for additional material and geometric flexibility in final fabricated part.

The introduction of different types of materials in to the bath vessel may be enhanced by enclosing the fabrication zone and liquid with a membrane cover. The membrane can be made of PDMS or any other relatively inert material; however it needs to have some gas permeability and be optically transparent. The membrane provides several advantages; 1) it dampens any disturbances on the free surface of the liquid monomer bath (this increase fabrication speeds) and 2) it creates a completely enclosed fluidic bath which results in smooth fluid flow around fabricated features. The membrane must be permeable so that there is a thin layer of gas between the membrane and the liquid otherwise fabricated features may stick to the membrane. The below figures show and schematic of how the membrane can be integrated into the PµSL system and some multimaterial parts fabricated with this technique.

BRIEF DESCRIPTION OF THE DRAWINGS

The accompanying drawings, which are incorporated into and form a part of the disclosure, are as follows.

DETAILED DESCRIPTION

Figure 1:
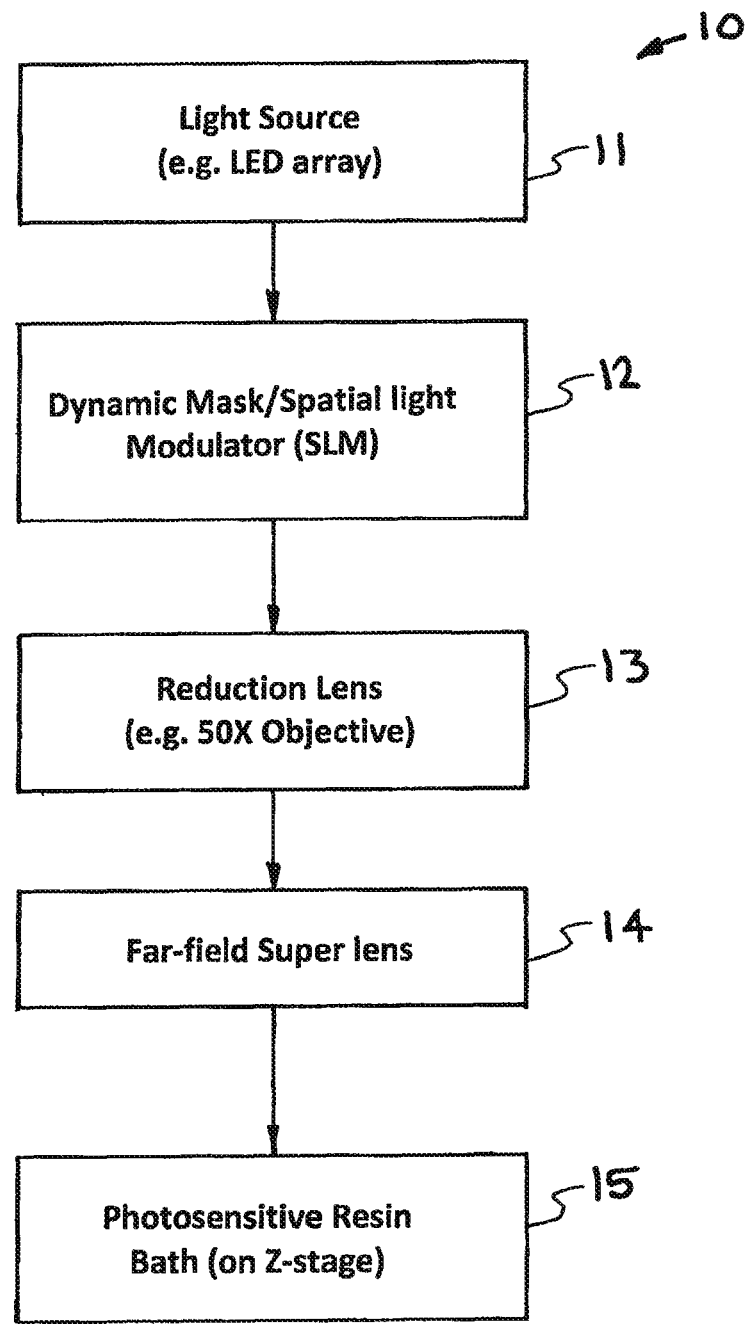
FIG. 1 is a flow diagram schematically illustrating the optical path taken in a first exemplary embodiment of the present invention for producing sub-diffraction-limited features.

Turning now to the drawings, FIG. 1 shows a flow diagram generally illustrating the primary components and the optical path of a first exemplary embodiment of a PμSL system 10 of the present invention to produce three-dimensional structures (e.g. meso- or micro-scale) with sub-diffraction-limited features. As shown in FIG. 1, the system 10 generally includes a light source 11, such as for example a UV LED array, which produces electromagnetic radiation (hereinafter "light") of a given wavelength, (e.g. 350 nm for UV). The system also includes a SLM 12 which functions as a dynamically configurable mask to produce a two-dimensional pattern/image from the light. The two dimensional image produced from the SLM 12 is then reduced by a reduction lens 13, and projected onto an FSL 14 which is positioned adjacent a photosensitive resin bath 14. The reduced two dimensional image from the SLM (i.e. far field image), is converted by the FSL 14 into a different two-dimensional image (i.e. near-field image) having sub-diffraction-limited features, i.e. features which exist below the diffraction limit. The near-field image then selectively cures local regions within the resin bath 14.

It is appreciated that the photosensitive resin bath contains a liquid, such as a liquid photosensitive monomer or resin, which is formed into a component when illuminated with the projected beam. In particular, the liquid converts to solid upon exposure to output of the superlens. Example material types include hexandiol diacrylate (HDDA), polyethylene glycol diacrylate (PEGDA), tBA-PEGDMA (a shape memory polymer), POSS-diacrylate, and there could also be nanoparticles in the liquid such as gold, copper, or ceramics. The photosensitive resin may also be loaded with ceramic, metal, or other particles to generate components of different materials. In this case, after initial stereolithographic fabrication, the parts can be sintered to remove the polymer and densify the functional material of interest. This usually shrinks the part by some controllable amount. It is also notable that by varying the intensity of the UV light, various porosity/density structures can be generated resulting in graded density materials. This could be combined with the superlens or holographic projection to generate graded density structures with <100 nm features.

Figure 2:
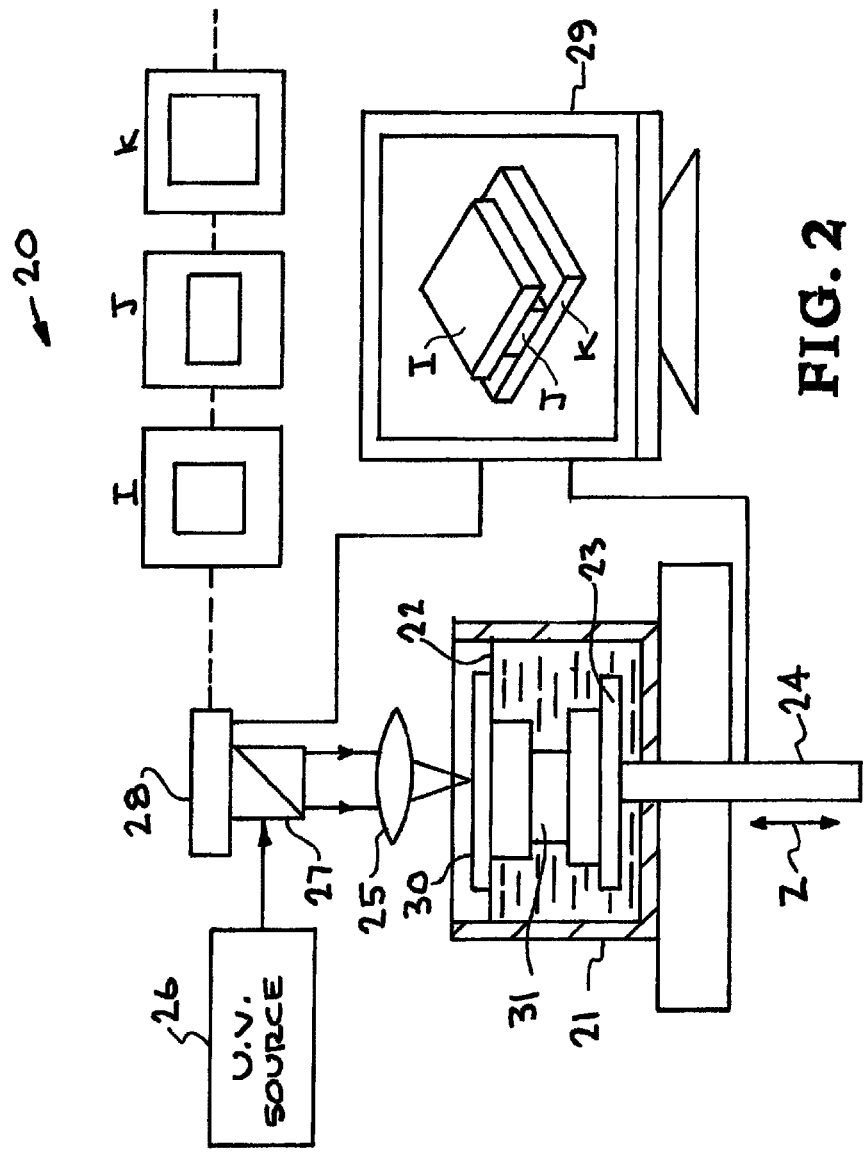
FIG. 2 shows a schematic view of a second exemplary embodiment of the present invention incorporating a far-field superlens in the optical path of the PµSL to produce sub-diffraction-limited features of 3D micro- and nano-structures in a layer-by-layer stereolithographic fabrication process.

FIG. 2 shows a second exemplary embodiment of the PuML system of the present invention having a light source 26 (shown as a UV source) which illuminates a SLM 28 via a beam splitter 27, and a reduction lens 25 which projects the image onto a FSL 30. The SLM is shown connected to a computer 29 which dynamically controls the SLM to produce various digital masks, such as masks i,j, and k. It is appreciated that the two-dimensional image formed by the SLM are not the actual part or features, rather they are the far-field image calculations corresponding to the desired near-field images to be produced by the FSL 30 which are then used to selectively cure portions of the photosensitive resin, as previously described in the Summary. As shown in FIG. 2, the FSL is positioned to contactedly interface directly with the photosensitive resin at a liquid surface 22. The resin is shown contained in a stereolithographic bath vessel 21, which is open at the top. A z-axis stage 23 and 24 is also provided for lowering the part (such as 31) as each layer is fabricated. The z-axis stage 23, 24 is also shown connected to the computer 29 so as to be controlled by the computer as each level is completed.

Figure 3A:
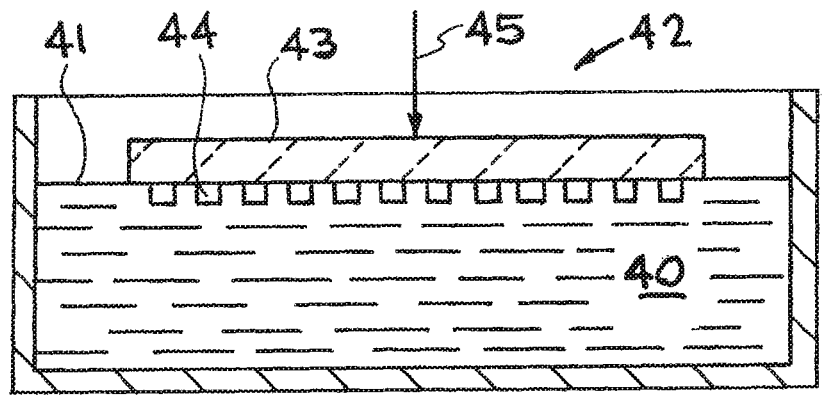
FIGS. 3A-C show schematic views of three exemplary methods of superlens-liquid interfacing.
Figure 3B:
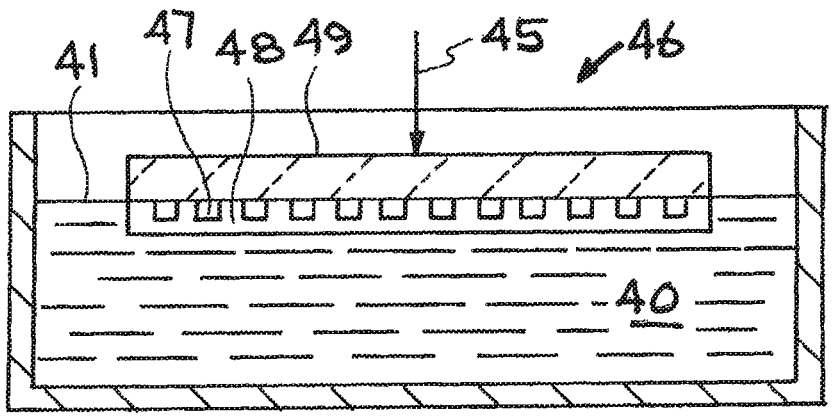
Figure 3C:
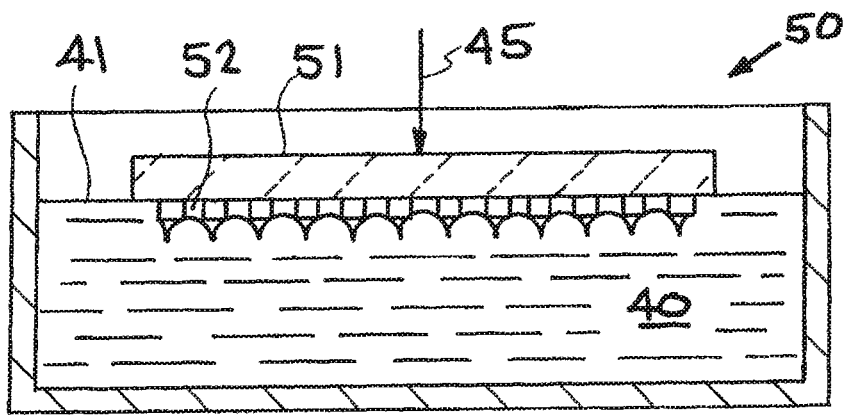

FIGS. 3A-C show three different embodiments by which the FSL may interface with the photosensitive liquid resin. Although the FSL is characterized as "far-field", this is only referring to one side of the lens. When a SLM-produced two-dimensional image is projected onto the FSL from the far-field, the FSL then generates near-field sub-wavelength features in the liquid monomer resin bath. Also, in order to have the required surface plasmons for the lens to work, the thin film of silver must have an interface with a dielectric material. It is appreciated that the FSL itself must be maintained in close proximity to the photosensitive liquid. However, it may not be desirable to use the liquid resin/monomer as the dielectric material since the fabricated features may simply stick to the FSL. FIG. 3A in particular shows an FSL 42 having a dielectric layer 43 and a metal grating layer 44 interfaced with the photosensitive resin 40 at a liquid surface 41. In particular, the metal grating layer 44 is shown without an intermediate dielectric material separating it from the resin, and instead directly contacts the photosensitive resin. And incoming light (e.g. the projected image) is shown at 45. FIG. 3B shows a second embodiment of the FSL 46 also having a dielectric layer 49 like FIG. 3A, but now also having an intermediate solid dielectric layer 48 which is formed (e.g. coated) over the metallic grating layer 47. The coating may be a very thin layer, e.g. <100 nm to provide the metal dielectric interface. Example material types may include PMMA, PDMS, glass, etc. And in FIG. 3C, another embodiment is shown having a dielectric layer 51, and where another liquid 52 (such as an oil) is used as the dielectric interlayer. As shown in the figure, a thin layer of the liquid dielectric 52 will remain in contact with the FSL 50 due to surface tension effect. Similar to the solid dielectric, the liquid dielectric interlayer provides the metal dielectric interface. In this case, the liquid 52 fills voids in the grating via surface tension effects and can provide a very thin layer. It also prevents cured components from sticking to the FSL. Example material types may include mineral oil, and other oils. The FSL may be held in placed on top of the liquid surface by conventional mounting hardware known in the art or, for example, on a motion stage to ensure good positioning. Furthermore, the FSL may be placed to cover the free liquid surface (in whole or in part).

Figure 4:
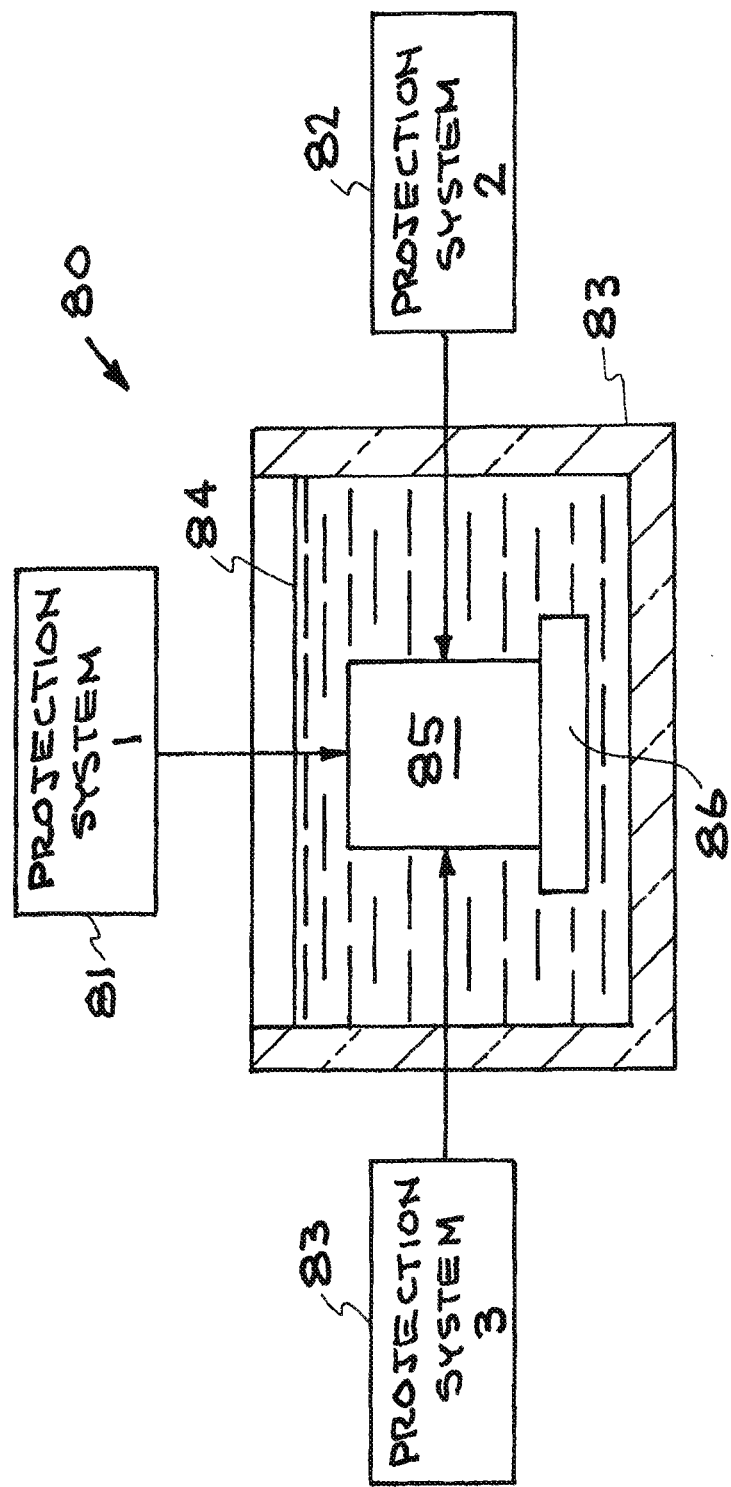
FIG. 4 shows a schematic view of another exemplary embodiment of the present invention showing multiple projection systems producing a structure based on a digital hologram generated by multiple SLMs arranged around a photosensitive resin bath for patterning 3D nanostructures without periodicity.

FIG. 4 shows a second exemplary embodiment of the system 80 of the present invention, with multiple electromagnetic radiation projection systems 81-83 together stereolithographically producing a three-dimensional structure 85 based on a digital hologram generated by the multiple projection systems. The structures may be aperiodic structures, designed features, or even fully 3D holograms. In particular, the projection systems 81-83 each have integrated SLMs (not shown) to produce digital masks, and are arranged around a photosensitive resin bath vessel 83 to produce a 3D holographic interference pattern in liquid resin for patterning 3D nanostructures without periodicity. The vessel 83 is shown as with optically transparent walls so that projections systems 82 and 83 may illuminate from the sides. The projection system 81 illuminates from the top through the open top side of the vessel 83 where the liquid level 84 is shown. A stage 86 (such as a z-axis stage) may also be provided where the holograpically produced structure may be positioned.

Figure 5:
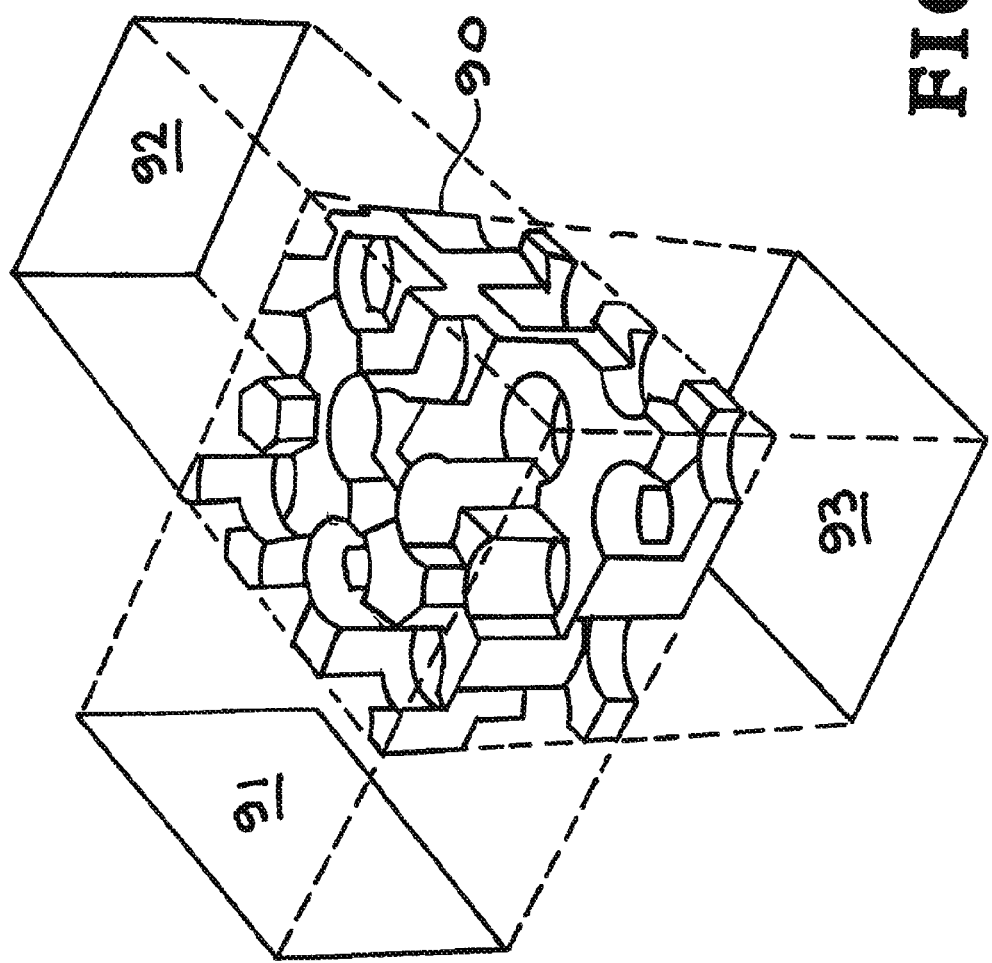
FIG. 5 shows an isometric illustration of three dynamically configurable masks corresponding to three interfering beams which produce a hologram of a complex 3D structure in a photosensitive resin bath to fabricate the 3D structure in a single snapshot/exposure.
Figure 8:
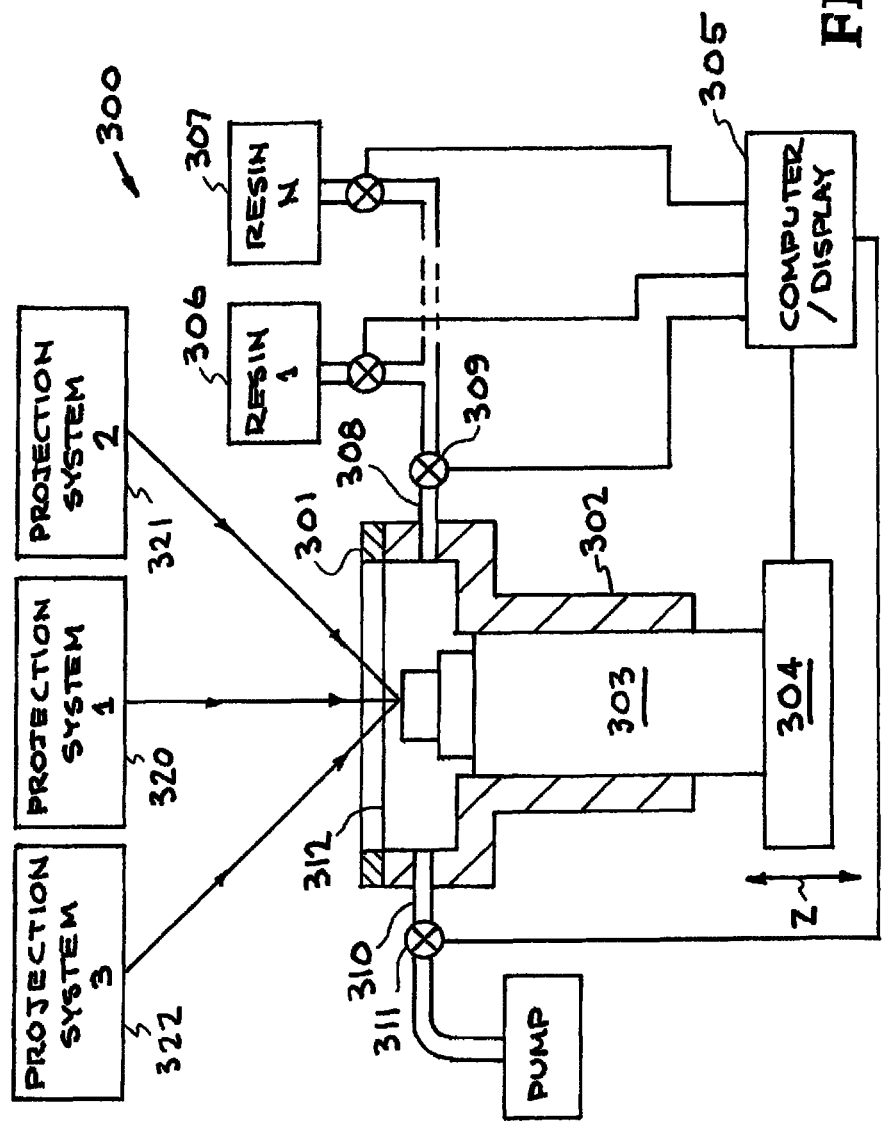
FIG. 8 is a schematic view of another exemplary embodiment of the system of the present invention incorporating multiple SLMS for 3D holographic stereolithography and a microfluidic system for using multiple materials.

Similarly, FIG. 5 shows an isometric illustration of three dynamically configurable masks 91-93 corresponding to three interfering beams which produce a hologram of a complex 3D structure 90 in a photosensitive resin bath to fabricate the 3D structure in a single snapshot/exposure. The three masks are shown orthogonally oriented, such as on xyz-axes. However, as shown in FIG. 8, multiple projection systems need not be orthogonal to each other. It is appreciated that each of the projections systems may also incorporate a FSL to produce sub-diffraction limited features when holographically interfered with the near-field images from the other projection systems. The holographic lithography interferes light beams from multiple digital masks rather than lasers, and can provide individual pixel control. With this control, the interference pattern between the two or more beams can be changed in 3D space resulting in locally controlled features and aperiodic structures. In addition, true 3D holograms may be generated and projected into the photosensitive monomer to generate 3D structures (without the need for Z-stage adjustment).

Figure 6:
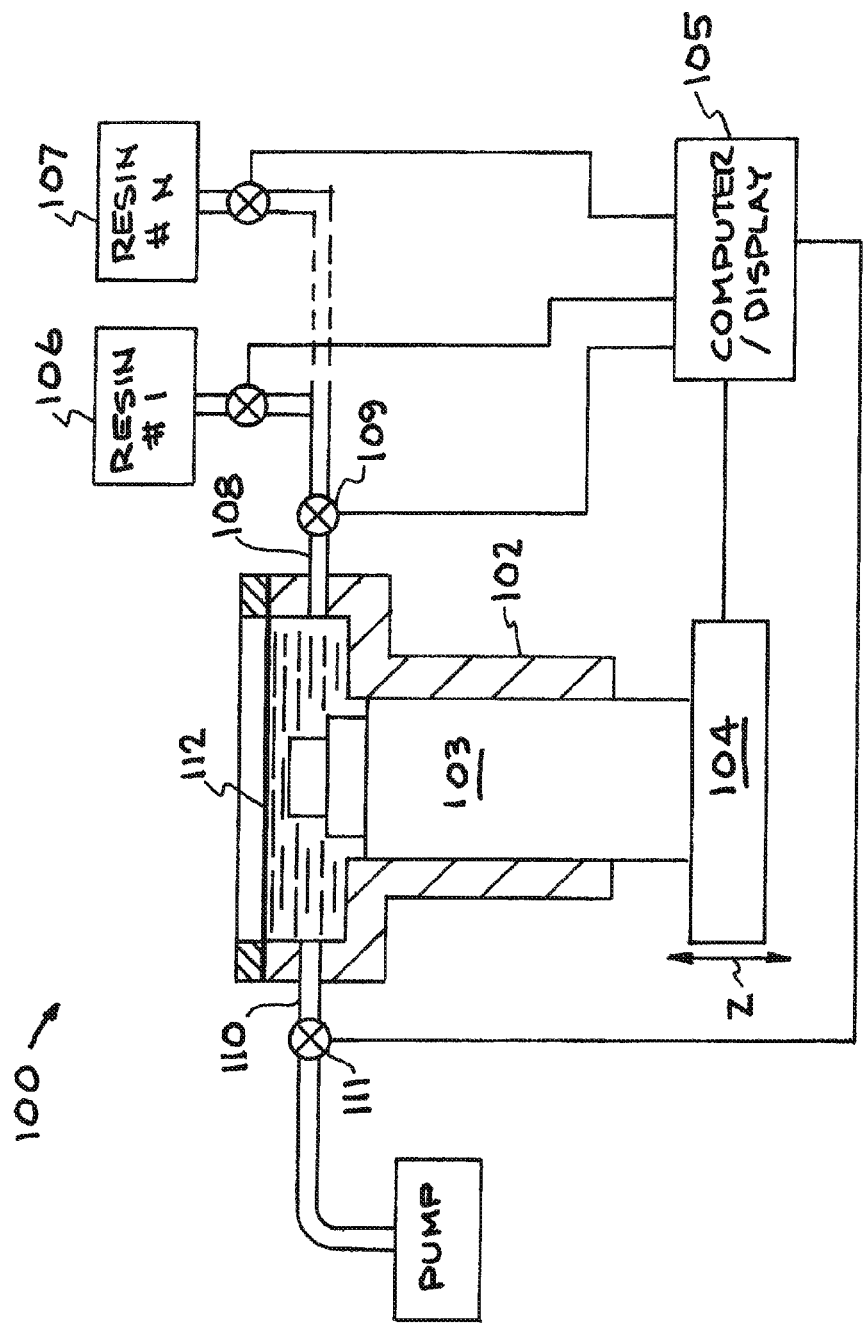
FIG. 6 shows a schematic view of an exemplary microfluidic system of the present invention for injecting multiple types of photosensitive resins into a bath vessel of a PµSL system.

FIG. 6 shows another exemplary embodiment of a microfluidic system 100 of the present invention, integrated with a larger PµSL system (not shown) to enable materials flexibility, i.e. fabricating multi-materials components, with multiple materials in either the same layer or across layers. This allows a broad range of materials to be used with PµSL to include metals, ceramics and a range of polymers. FIG. 6 shows in particular a PµSL bath vessel 101 having a cylinder 102 and a piston 103. The top of the cylinder is open and contains a photosensitive resin. The top of the piston 103 is shown as the fabrication stage and is connected to a z-stage 104 for lowering/elevating the fabricated part, typically in a layer-by-layer process. The cylinder 102 walls may be optically transparent so as to enable illumination by image projectors (not shown). The system 100 is shown having an inlet 108 fluidically connected to at least two different photosensitive resin sources 106 to 107, which are connected to supply the vessel with different photosensitive liquids. A control valve 109 is shown connected to a computer 105 (or other controller) for controlling injection of resin into the bath vessel. An outlet port 110 is also shown for exhausting photosensitive liquid from the bath container, so that the vessel may be emptied of a first photosensitive liquid used to produce a first feature of a fabricated structure prior to filling with a second photosensitive liquid used to produce a second feature of the fabricated structure. And a control valve 111 is also shown connected to the computer 105 for controlling flow out of the vessel.

FIG. 6 also shown a membrane 112 which may be positioned at the liquid surface, so as to enable laminar flow when resin is moved in and out of the vessel. The membrane is preferably optically transparent, as well as flexible so as to deform when fluid is moving in/out and eliminate liquid free surface disturbance. Optionally, the membrane may be gas permeable. Example material types include PDMS, glass, quartz, and other clear flexible polymers. It is notable that if an FSL is used, the membrane may or may not be used since the FSL would cover the free surface in place of the membrane. However, since the FSL is a thin film structure it can also be deposited on the membrane 112, such as in combination with radical inhibition layer.

Figure 7:
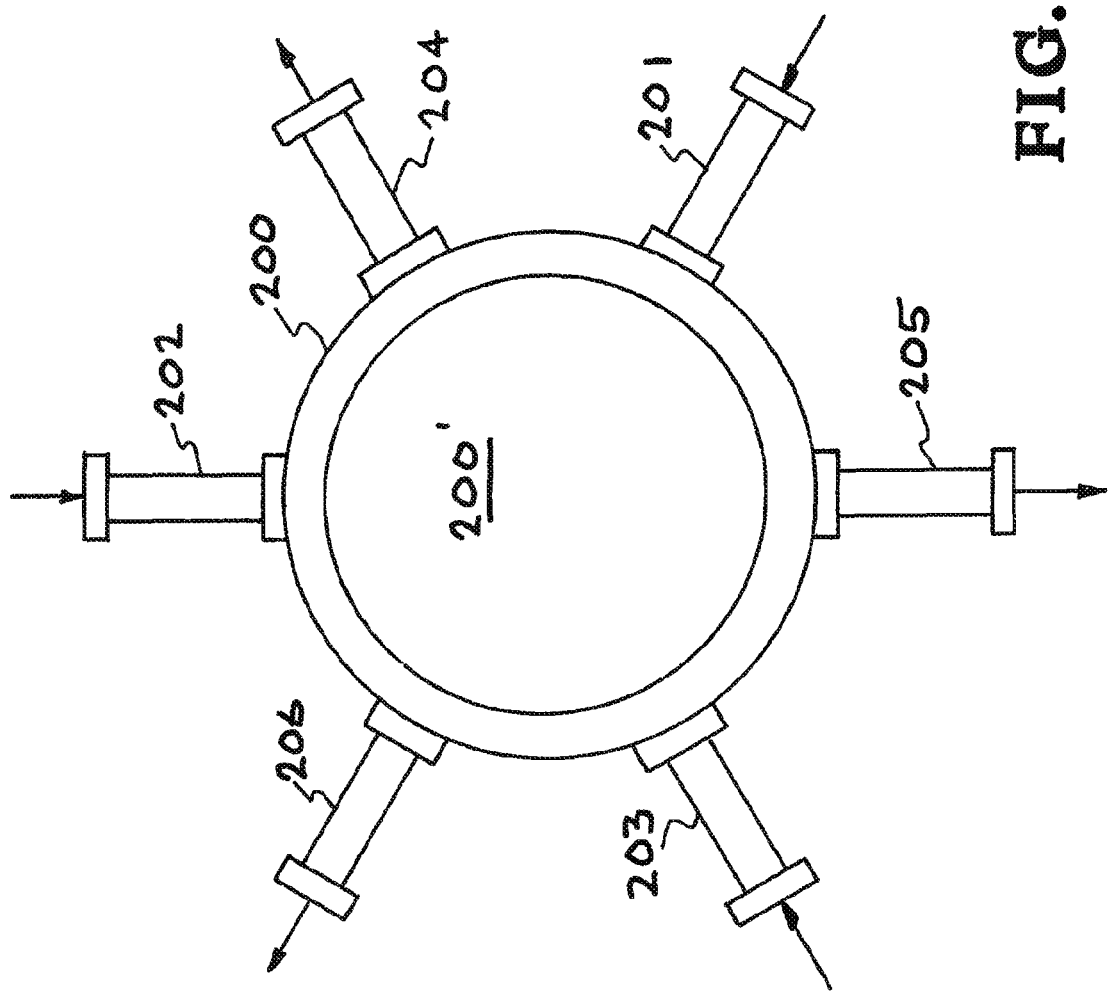
FIG. 7 is a top view of an exemplary bath vessel of a PµSL having three injection ports and three outlet ports of an integrated microfluidic system.

FIG. 7 shows a top view of another embodiment of the microfluidic system integrated into the PSL of the present invention. In particular, a bath vessel 200 used in a P µSL system and adapted to contain a photosensitive resin therein is shown having multiple inlet and outlet ports 201-206 connected along its walls, and preferably near the liquid surface. The injection or inlet ports are indicated at 201-203, and the exhaust or outlet ports are indicated at 204-206. Each of the inlet ports are in fluidic communication with one or more different types of photosensitive resin reservoir or sources to provide the vessel basin 200' with the desired material. In one particular embodiment, each inlet port may be connected with a unique material, while in an alternative embodiment, each inlet port may be connected to each of the various types of resins available.

And FIG. 8 shows a combined system 300 having the features of a multiple projection system for 3D holographic fabrication and an integrated microfluidic system for multiple material delivery. In particular, three projection systems 321-322 are shown, which project two-dimensional images into the fabrication zone characterized by a bath vessel 301. Similar to FIG. 36, the system includes a PµSL bath vessel 301 having a cylinder 302 and a piston 303. The top of the cylinder is open and contains a photosensitive resin. The top of the piston 303 is shown as the fabrication stage and is connected to a z-stage 304 for lowering/elevating the fabricated part, typically in a layer-by-layer process. The cylinder 302 walls may be optically transparent. And ports 308 and 310 are connected to the bath vessel and controlled by valves 309 and 311, respectively. Furthermore a computer 305 controls the z-stage 304 and the valves 309, 311. While not shown in FIG. 8, each of the projections systems 301-301 may incorporate a FSL such that the image projected into the fabrication zone is a near-field image. And similar to the membrane 112 of FIG. 6, FIG. 8 also shows a membrane 312 positioned at the liquid surface.

While particular embodiments and parameters have been described and/or illustrated, such are not intended to be limiting. Modifications and changes may become apparent to those skilled in the art, and it is intended that the invention be limited only by the scope of the appended claims.

We claim:

1. A projection micro-stereolithography (PµSL) system for producing sub-diffraction-limited features, comprising:
    a light source;
    a spatial light modulator (SLM) illuminated by the light source;
    a reduction lens;
    a stereolithographic bath containing a photosensitive resin; and
    a far-field superlens (FSL) contactedly interfacing the photosensitive resin, said FSL including a dielectric layer and a metal grating layer
    wherein the FSL is arranged to convert a far-field image produced by the SLM and reduced by the reduction lens into a near-field image for curing select regions of the photosensitive resin.

2. The projection micro-stereo lithography (PµSL) system of claim 1,
    wherein the FSL further includes a dielectric interlayer between the metal grating layer and the photosensitive resin.

3. The projection micro-stereolithography (PµSL) system of claim 2,
    wherein the dielectric interlayer is a solid.

4. The projection micro-stereolithography (PµSL) system of claim 2,
    wherein the dielectric interlayer is a liquid.

5. A projection micro-stereolithography (PµSL) system, comprising:
    a light source;
    a spatial light modulator (SLM) illuminated by the light source;
    a reduction lens;
    a stereolithographic bath containing a photosensitive resin; and a microfluidic system integrated with the stereolithographic bath, said microfluidic system having at least one inlet port fluidically connected to deliver at least one type of photosensitive resin from at least one source, and at least one outlet port.

6. The projection micro-stereolithography (PμSL) system of claim 5,
wherein the microfluidic system further including a membrane in contact with a top liquid surface of the photosensitive resin.

* * * * *